United States Patent [19]

Leyrer et al.

[11] Patent Number: 4,465,760

[45] Date of Patent: Aug. 14, 1984

[54] PRODUCTION OF RELIEF IMAGES OR RESIST IMAGES BY A NEGATIVE-WORKING METHOD

[75] Inventors: Reinhold J. Leyrer, Ludwigshafen; Dietrich Saenger, Frankenthal; Uwe Klinsmann, Mannheim, all of Fed. Rep. of Germany

[73] Assignee: BASF Aktiengesellschaft, Fed. Rep. of Germany

[21] Appl. No.: 525,394

[22] Filed: Aug. 22, 1983

[30] Foreign Application Priority Data

Aug. 21, 1982 [DE] Fed. Rep. of Germany ....... 3231145

[51] Int. Cl.$^3$ .................. G03F 7/10; G03C 1/495; G03C 1/71; G03C 5/16
[52] U.S. Cl. .................................... 430/325; 430/270; 430/280; 430/327; 430/330; 430/328
[58] Field of Search ............... 430/330, 325, 327, 328, 430/935, 927, 270, 280

[56] References Cited

U.S. PATENT DOCUMENTS

| | | | |
|---|---|---|---|
| 3,895,952 | 7/1975 | Schlesinger | 96/115 R |
| 3,926,636 | 12/1975 | Barzynski et al. | 96/115 R |
| 3,949,143 | 4/1976 | Schlesinger | 428/413 |
| 3,996,052 | 12/1976 | Schlesinger | 96/35.1 |
| 4,035,189 | 7/1977 | Hayashi et al. | 96/115 R |
| 4,400,461 | 8/1983 | Chandross | 430/311 |

FOREIGN PATENT DOCUMENTS

| | | |
|---|---|---|
| 2150691 | 4/1973 | Fed. Rep. of Germany . |
| 2309062 | 9/1973 | Fed. Rep. of Germany . |
| 2242394 | 3/1974 | Fed. Rep. of Germany . |
| 2361141 | 8/1974 | Fed. Rep. of Germany . |
| 2922746 | 12/1980 | Fed. Rep. of Germany . |

OTHER PUBLICATIONS

Derwent Patent Reports: Derwent Publications Ltd., London, Great Britain, DT 2922-746, Derwent Access No. 90328, C/51, (BASF AG).

Primary Examiner—John E. Kittle
Assistant Examiner—Cynthia Hamilton
Attorney, Agent, or Firm—Keil & Weinkauf

[57] ABSTRACT

Relief images or resist images are produced by a negative-working process, using a photosensitive resist layer which is applied on a base and contains a compound possessing two or more aromatic and/or heteroaromatic o-nitrocarbinol ester groups as well as a crosslinking compound possessing two or more reactive groups which are capable, under the action of heat, of reacting with carboxyl groups to form a covalent chemical bond. To produce the relief images or resist images, the photosensitive resist layer is first exposed imagewise to actinic light, the exposed areas of this layer are subjected to selective thermal hardening and crosslinking and the resist layer is then post-exposed uniformly to actinic light and finally washed out with an aqueous developer.

14 Claims, No Drawings

PRODUCTION OF RELIEF IMAGES OR RESIST IMAGES BY A NEGATIVE-WORKING METHOD

The present invention relates to a negative-working process for the production of relief images, eg. offset printing plates, or resist images on a base by means of a photosensitive recording material which comprises a resist layer which is applied to the base, is curable and crosslinkable after exposure and contains, as the photosensitive component, a compound possessing two or more aromatic and/or heteroaromatic o-nitrocarbinol ester groups. To produce the relief images or resist images, the photosensitive resist layer is exposed imagewise to actinic light, the exposed areas of this layer are subjected to selective thermal hardening and crosslinking, and the non-crosslinked areas of the said layer are then washed out with a developer.

A large number of negative-working photosensitive recording materials and processes for producing images by means of these recording materials are known. For the purposes of the present invention, negative-working recording materials or negative-working processes for producing images are those in which, after imagewise exposure of the photosensitive layer, the exposed areas of this layer become insoluble in solvents in which they were previously soluble. Hence, the unexposed areas of the photosensitive layer are removed during development, and a negative image of the image-bearing transparency is obtained.

In general, negative-working recording materials are based on photopolymerizable mixtures which contain a photopolymerizable compound and a photoinitiator in addition to a polymeric binder. On exposure to actinic light, photoinitiated polymerization in the exposed areas of the mixture results in crosslinking and hence causes these areas to exhibit a different solubility to the unexposed areas. In the case of the photopolymerizable materials described in German Laid-Open Application DOS No. 2,361,141, the polymerization and crosslinking can be reinforced by the action of heat after the exposure, without the thermal stability and shelf life of the materials before the exposure being adversely affected. If the conventional negative-working photopolymerizable recording materials are to be washed out with aqueous developers, it is necessary to use polymeric binders which are soluble in aqueous media; consequently, the stability of the resulting relief images or resist images to aqueous media, in particular to alkalis or acids, is inadequate for many fields of use.

German Published Application DAS No. 2,309,062 discloses that relief images or resist images can be produced from photosensitive layers which contain an aromatic o-nitrocarbinol ester-containing compound as well as an epoxy resin prepolymer, by a method in which the photosensitive layer is exposed imagewise, the latent image produced by exposure is selectively hardened in the exposed layer by heat treatment, and the unexposed, unhardened parts of the layer are then removed by means of a solvent. However, this process, which likewise is negative-working, requires, as a rule, an organic solvent for developing the exposed and selectively hardened layer. In order to be able to carry out the development in aqueous solvents, o-nitrocarbinol ester-containing compounds which are water-soluble as such have to be employed in this process. In this case, however, the relief image or resist image produced also does not possess the requisite stability to the chemicals used in further processing, in particular to strong alkalis or acids as used in, for example, electroplating baths or etching baths. The strength of such layers is also insufficient for them to be used for offset printing plates intended for long runs.

German Laid-Open Applications DOS Nos. 2,150,691 and 2,922,746 describe recording materials, for the production of relief images or resist images, whose photosensitive layer is based on o-nitrocarbinol ester-containing polymers which can be washed out with an aqueous alkaline solvent after exposure. However, these conventional coating materials, which can be used for the production of resist layers or lithographic printing plates, are positive-working; moreover, they are still unsatisfactory with regard to their thermal stability after exposure and development and their resistance to strong and aggressive acids and alkalis.

Finally, German Laid-Open Application DOS No. 2,242,394 describes mixtures which are curable under the action of light and comprise an aromatic or heteroaromatic o-nitrocarbinol ester-containing compound and aziridine- or isocyanate-containing compounds. According to DOS No. 2,242,394, these photocurable mixtures are used for the production of moldings, impregnations, coatings, coverings, printing inks, etc. For this purpose, the photosensitive layers and coverings produced from these mixtures are exposed uniformly and thoroughly hardened. The production of relief images or resist images is not discussed in this publication.

It is an object of the present invention to provide a negative-working process for the production of relief images, such as offset printing plates, or resist images, by means of a recording material comprising a photosensitive resist layer, wherein the exposed resist layer can be washed out with an aqueous developer, but the resulting relief image or resist image nevertheless has improved resistance to aqueous media, in particular the strong alkalis or acids used in electroplating baths or etching baths, and moreover exhibits good adhesion on the base, good thermal stability, high mechanical strength and good insulating properties, such as tracking resistance and dielectric strength. The process should be easy to carry out, flexible and widely applicable and, in particular, should provide high resolution and permit the production of relief images or resist images which are exact and faithful to the original.

We have found that, surprisingly, this object is achieved if a photosensitive recording material is employed whose photosensitive layer contains a compound possessing two or more aromatic and/or heteroaromatic o-nitrocarbinol ester groups and a compound which effects crosslinking and possesses two or more reactive groups which are capable of reacting with —COOH groups to form a covalent chemical bond, and this photosensitive layer is exposed imagewise to actinic light, the exposed areas of the layer are subjected to selective thermal hardening and crosslinking and the layer is then post-exposed uniformly to actinic light and finally washed out with an aqueous developer.

The present invention accordingly relates to a process for the production of relief images or resist images, which constitute a negative image of an image-bearing transparency, wherein a photosensitive resist layer which is applied to a base, is crosslinkable after exposure and contains, as the photosensitive component, a compound possessing two or more aromatic and/or heteroaromatic o-nitrocarbinol ester groups of the general formula (I)

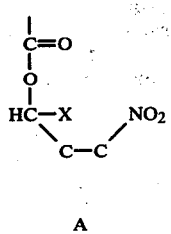

where A is the radical of an unsubstituted or substituted 5-membered to 14-membered aromatic or heteroaromatic ring system, and X is hydrogen, alkyl of 1 to 8 carbon atoms or an unsubstituted or substituted aryl or aralkyl radical, is exposed imagewise to actinic light, the exposed areas of the resist layer are subjected to selective thermal hardening and crosslinking, and the non-crosslinked areas of this layer are then washed out with a developer. In this process, the photosensitive resist layer contains a compound which effects crosslinking and possesses two or more reactive groups which are capable of reacting with —COOH groups under the action of heat to form a covalent chemical bond, and the resist layer is exposed imagewise, the exposed areas are subjected to selective thermal hardening and crosslinking and the said layer is then post-exposed uniformly to actinic light, after which it is washed out with an aqueous developer.

It is very surprising, and in no way forseeable, that, in spite of the uniform post-exposure of the imagewise exposed and selectively hardened resist layer, the resulting relief image or resist image is very resistant to aqueous media. For example, an aqueous solvent can be used to develop the imagewise exposed resist layer without the relief structure being adversely affected. The novel process gives relief images and resist images which are very stable to aqueous treating media, in particular strong alkalis or acids, as used in electroplating baths or in etching baths. The resulting relief images or resist images possess good thermal stability, ie. they still have very high mechanical strength even at relatively high temperatures, eg. above 100° C. Furthermore, they exhibit high tracking resistance and dielectric strength, which make them particularly useful as solder masks in the production of printed circuits. The novel process can be used for the faithful and exact reproduction of even very fine image sections, such as lines, linework or dots, even in thin layers. A particular advantage of the novel process is that, depending on the intended use, the degree of hardening and the degree of crosslinking and hence the layer properties can be adjusted continuously via the type and amount of compounds which effect crosslinking and are present in the photosensitive layer, via the temperature used during hardening and crosslinking, and if appropriate via subsequent crosslinking after washing out with the aqueous developer. The high abrasion-resistance of the image sections produced permits the production of lithographic printing plates which give particularly long print runs.

The novel process is carried out using a photosensitive recording material comprising a photosensitive resist layer applied to a base. The choice of the base depends on the intended use of the relief image or resist image to be produced. Examples of suitable bases are metallic, metal oxide or ceramic substrates, as well as films and sheets of polymeric substances. For example, copper sheets or copper-plated substrates are used as bases for the production of etch resists or plating resists. For the production of thin-film integrated circuits, in particular ceramic substrates, which are coated with metallic or metal oxide layers, or semiconductor elements are employed as bases. For the production of relief images, in particular offset printing plates, suitable bases are metals, eg. steel or aluminum sheets which have been mechanically or electrochemically roughened and/or possess an anodically produced oxide layer, or plastic films, eg. of polyesters, which may also be coated with the metal by vapor deposition. For the production of a solder mask, the photosensitive resist layer can, for example, be applied to the circuit diagram of a printed circuit as the base, this being done by a conventional technique, either from solution, eg. by spin-coating, casting, immersion, etc., or by a conventional dry lamination process.

The photosensitive resist layers employed in the novel process contain, as the photosensitive component, a compound possessing two or more aromatic and/or heteroaromatic o-nitrocarbinol ester groups of the general formula (I)

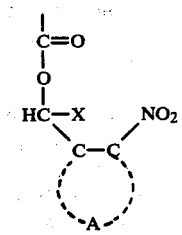

where A is the radical of an unsubstituted or substituted 5-membered to 14-membered aromatic or heteroaromatic ring system, and X is hydrogen, alkyl of 1 to 8 carbon atoms or an unsubstituted or substituted aryl or aralkyl radical.

The aromatic or heteroaromatic ring system A containing the nitro group in the ortho-position can be mononuclear or polynuclear. A particularly preferred aromatic ring system is benzene, and the benzene ring can be monosubstituted or polysubstituted, for example by $C_1$–$C_8$-alkyl, in particular methyl, by $C_1$–$C_6$-alkoxy, in particular methoxy, by halogen, eg. chlorine or bromine, or by nitro, amino, monomethylamino, dimethylamino, nitrile or sulfo. Examples of polynuclear aromatic ring systems are naphthalene, anthracene, anthraquinone, phenanthrene and the corresponding substituted derivatives. A preferred heteroaromatic ring system is the pyridine radical. X is, in particular, hydrogen, methyl, ethyl or unsubstituted or substituted phenyl.

Examples of particularly preferred aromatic or heteroaromatic o-nitrocarbinols from which the o-nitrocarbinol ester groups of the general formula (I) are derived are o-nitrobenzyl alcohol, 2-nitro-6-chlorobenzyl alcohol, 2-nitro-4-cyanobenzyl alcohol, 2-nitro-4,5-dimethoxybenzyl alcohol, α-methyl-o-nitrobenzyl alcohol, α-phenyl-o-nitrobenzyl alcohol, α-(o-nitrophenyl)-o-nitrobenzyl alcohol and 2-nitro-3-hydroxymethylpyridine.

Suitable compounds containing aromatic and/or heteroaromaic o-nitrocarbinol ester groups are low molecular weight esters possessing two or more ester groups of the general formula (I). These include, in particular, the diesters and/or polyesters of low molecular weight dicarboxylic acids and/or polycarboxylic acids with aromatic and/or heteroaromatic o-nitrocarbinols of the type discussed. Examples of low molecular weight dicarboxylic acids and polycarboxylic acids from which such esters can be derived are oxalic acid, malonic acid, adipic acid, maleic acid, fumaric acid, terephthalic acid, trimellitic acid and trimesic acid.

If low molecular weight compounds containing o-nitrocarbinol ester groups are employed as the photosensitive component, the photosensitive resist layer advantageously also contains a polymeric binder which is compatible with these esters; for example, acrylate and/or methacrylate polymers have proved particularly useful for this purpose. Other suitable polymeric binders for the photosensitive resist layer are the high molecular weight compounds described below, which effect crosslinking and possess groups which are reactive toward carboxyl groups. Where low molecular weight compounds containing o-nitrocarbinol ester groups are used as the photosensitive component, the amount of these in the photosensitive resist layer is such that the desired degree of hardening and of crosslinking of the imagewise exposed resist layer is achieved, and this layer, after uniform post-exposure, can be washed out with the aqueous developer. For this purpose, it is generally sufficient if the photosensitive resist layer contains from 2 to 30, in particular from 10 to 15, % by weight, calculated as —COO— and based on the total photosensitive resist layer, of the low molecular weight compound possessing aromatic and/or heteroaromatic o-nitrocarbinol ester groups of the formula (I).

Photosensitive resist layers which have proved particularly useful in the novel process are those which contain, as the photosensitive component, a polymer which has a molecular weight of above 500 and contains not less than 5% by weight, based on the molecular weight of the polymer, of aromatic and/or heteroaromatic o-nitrocarbinol ester groups of the general formula (I) bonded in the molecule. Regarding these polymers and their preparation, reference may be made, in particular, to German Laid-Open Application DOS No. 2,150,691, cited at the outset. An advantageous o-nitrocarbinol ester-containing polymer is an organic polycarboxylic acid whose carboxyl groups are esterified with the aromatic and/or heteroaromatic o-nitrocarbinols. The organic polycarboxylic acids are in general homopolymers or copolymers of ethylenically unsaturated mono- or dicarboxylic acids of 3 to 6 carbon atoms, in particular of acrylic acid, methacrylic acid, maleic acid, fumaric acid or crotonic acid. Particularly important comonomers are ethylene, styrene and the $C_1-C_8$-alkyl esters of the above ethylenically unsaturated carboxylic acids.

It should be pointed out that virtually all carboxyl groups of the o-nitrocarbinol ester-containing polycarboxylic acid must be esterified or be present in a form which cannot react directly with the reactive groups of the crosslinking component described below, if it is desired that the photosensitive resist material, in the form of a solution or of a film resist material, have a long shelf life in the dark or in yellow light. Otherwise, there is a danger that the said resist material will undergo partial crosslinking and hardening even before imagewise exposure to actinic light, for example during storage of the recording material, with the result that it would only be of limited use for the novel process.

The amount of o-nitrocarbinol ester groups of the formula (I) present in the polymer is in general not less than 5% by weight, based on the molecular weight of the polymer, and can vary within wide limits, depending on the desired properties of the photosensitive resist layer and of the relief images or resist images produced from this. During exposure to actinic light, the o-nitrocarbinol ester groups undergo cleavage, and free carboxyl groups are formed in the polymer, with the result that the solubility of the latter is changed; hence, the content of o-nitrocarbinol ester groups of the general formula (I) in the polymers should be chosen so that the polymers, after exposure of the photosensitive resist layer, are soluble or dispersible in aqueous solvents, eg. water or aqueous alkaline solutions, and can be washed out with the aqueous developer.

The photosensitive resist layer employed in the novel process also contains a compound which effects crosslinking and contains two or more reactive groups which are capable of reacting with —COOH groups under the action of heat to form a covalent chemical bond. Since, in the novel process, the development of the imagewise exposed resist layer takes place after uniform post-exposure, the reactivity of these reactive groups which effect crosslinking should be adapted to the process conditions prevailing during uniform post-exposure and in the subsequent development of the resist layer, in particular the duration of, and the temperature used in, the development, so as to ensure that the areas of the resist layer which have not been exposed imagewise and have not been subjected to thermal hardening can be satisfactorily washed out with the aqueous developer. If, for example, the time between the uniform post-exposure of the resist layer and the development is too long, or the development time is too long or the development temperature is too high, with respect to the reactivity of the compound which effects crosslinking and contains reactive groups, it may be possible for the carboxyl groups produced during uniform post-exposure to react, in those areas of the resist layer which have not been exposed imagewise, with the crosslinking compound before or during development, so that satisfactory development of the relief image or resist image is not ensured. The photosensitive resist layer therefore preferably contains those crosslinking compounds which react with the free carboxyl groups at a noticeable rate only at elevated temperatures, for example at above 40° C. Examples of reactive crosslinking groups of the type under discussion which are particularly useful for the novel process are amine, imine, amide, epoxide, hydroxyl and/or blocked or unblocked isocyanate groups.

In one embodiment of the novel process, the photosensitive resist layer used can contain the aromatic and/or heteroaromatic o-nitrocarbinol ester groups of the general formula (I) and the crosslinking reactive groups of the above type bonded in one and the same molecule. Such compounds are, in particular, copolymers which carry aromatic and/or heteroaromatic o-nitrocarbinol ester groups and which contain, as copolymerized units, comonomers possessing the crosslinking groups which are reactive to carboxyl groups, eg. amine, imine, amide, epoxide, hydroxyl and/or blocked or unblocked isocyanate groups. Particularly suitable comonomers of this type are those containing epoxide, hydroxyl, isocyanate and/or blocked isocyanate groups, for example N,N-dimethylaminoethyl acrylate or methacrylate; N- vinylimidazole; acrylamide or methacrylamide; and preferably glycidyl esters of unsaturated acids, in particular of acrylic acid or methacrylic acid, such as glycidyl acrylate or methacrylate; glycidyl ethers of unsaturated alcohols, such as allyl glycidyl ether or 4-vinylcyclohexene dioxide; vinyl isocyanate or allyl isocyanate; monoesters of diols with unsaturated acids, in particular with acrylic acid or methacrylic acid, such as hydroxyethyl acrylate or methacrylate, hydroxypropyl acrylate or methacrylate or butanediol monoacrylate or monomethacrylate; and methylol compounds of the amol type, eg. N-methylolacrylamide.

In another embodiment of the invention, the photosensitive resist layer can contain the crosslinking compounds, which possess reactive groups, in addition to the compounds containing aromatic and/or heteroaromatic o-nitrocarbinol ester groups. In this case, the crosslinking compounds can be high molecular weight compounds, eg. appropriate polymers, or appropriate low molecular weight compounds. If the said crosslinking compounds are introduced into the photosensitive resist layer as components of the mixture, they should be compatible with the compound containing the aromatic and/or heteroaromatic o-nitrocarbinol ester groups. Preferred classes of crosslinking compounds which possess two or more reactive groups and can be present as such components in the photosensitive layer are diepoxides or polyepoxides, free or blocked di- or polyisocyanates, carbodiimides, dihydroxides or polyhydroxides and diamines or polyamines. The photosensitive resist layer may contain one or more of the crosslinking compounds, for example two or more different crosslinking compounds, such as epoxides, isocyanates and/or blocked isocyanates.

The diepoxides or polyepoxides include the reaction products of epichlorohydrin with polyols, the reaction products of epichlorohydrin with polyamines, polyolefin-epoxides, epoxidized polybutadiene, epoxy resins of the novolak type, high polymers of glycidyl esters of unsaturated carboxylic acids, in particular of acrylic acid or methacrylic acid, and other compounds. Of particular interest are the epoxides based on epichlorohydrin and bisphenol A. By substitution of the bisphenol A, it is possible to influence the properties of these epoxides; for example, increased flame-retardance is achieved if epoxides based on halogenated bisphenol A, eg. tetrabromobisphenol A or tetrachlorobisphenol A, are employed. Another group of suitable epoxides are those in which the terminal glycidyl groups are bonded via aliphatic or aralipathic radicals. A typical member of this class is the diglycidyl ether of butane-1,4-diol. For example, owing to the less rigid molecular structure, epoxides of this type lead to more flexible hardened products. If, instead of the polyhydric alcohols, amines are used with epichlorohydrin for the preparation of the epoxide compounds, epoxypropylamines having a structure similar to that of the glycidyl ethers are obtained. A typical compound of this type is bis-(epoxypropyl)aniline, which, because of its extremely low viscosity, can be employed as a bifunctional diluent. Important high molecular weight crosslinking compounds include epoxy resins of the novolak type. Because of their high functionality, they react with the photochemically produced carboxylic acid groups to give highly crosslinked systems having high heat distortion resistance. The same applies where polyglycidyl acrylates or methacrylates or other glycidyl-containing polymers are used.

If a cycloaliphatic epoxide whose molecule contains one or more cycloaliphatic rings but not aromatic rings is employed, it is possible, for example, to increase the shelf life, the stability to UV light and the tracking resistance. In the cycloaliphatic epoxides, the epoxide oxygen can be bonded exclusively to the cycloaliphatic rings, as, for example, in dicyclopentadiene dioxide, exclusively in the side-chains, as, for example, in the diglycidyl ester of hexahydrophthalic acid, or to the cyclic rings as well as the side-chains, as, for example, in vinylcyclohexane dioxide.

Other suitable crosslinking compounds are the conventional polyisocyanates containing two or more isocyanate groups per molecule, for example alkyl and cycloalkyl diisocyanates where alkyl or cycloalkyl is preferably of 4 to 41 carbon atoms, such as dimeric acid isocyanate, isophorone diisocyanate, dicyclohexylmethane diisocyanate, butane-1,4-diisocyanate, hexamethylene diisocyanate, heptadecane diisocyanayte, 2,2,4-trimethylhexamethylene diisocyanate or 2,6-diisocyanatomethyl caproate, isocyanurate-isocyanates, eg. the product from the reaction of toluylene 2,4-diisocyanate with hexamethylene diisocyanate, biurets, eg. hexamethylene diisocyanate biuret, aryl diisocyanates and triisocyanates, eg. toluylene diisocyanate, diphenylmethane diisocyanate, naphthylene diisocyanate, triphenylmethane triisocyanate or xylylene diisocyanate, mixed aliphatic/aromatic di- and triisocyanates, di- and triisocyanates containing functional groups, eg. carbonylisocyanates, such as carbonyl diisocyanate or isophthaloyl diisocyanate, sulfaryl isocyanates, sulfonyl diisocyanate, m-phenylenedisulfonyl diisocyanate, allophanate isocyanates, heteroatom-containing di- and triisocyanates, eg. reaction products of hexamethylcyclotrisilazane and diphenylmethane diisocyanate, as well as isocyanate-containing polymers, eg. copolymers of vinyl isocyanate, and hydroxyl- and/or amino-containing polymers or polycondensates which have been reacted with an excess of a di- or triisocyanate.

Since, in the novel process, the photosensitive resist layer is brought to a state in which it can be hardened by heat only as a result of the action of actinic light, it is not necessary for the isocyanate component to be blocked in order for the photosensitive resist material to have a very long shelf life before it is processed by the method according to the invention. However, if in the process according to the invention it is desired to have a high degree of latitude between uniform post-exposure of the resist layer and the development, for example particularly when these process steps do not automatically take place in succession, it is advantageous to use blocked isocyanates as the crosslinking component in the photosensitive resist layer. The blocked isocyanates undergo cleavage only at elevated temperatures to give the starting components once again, so that when such isocyanates are used as crosslinking compounds the resist layer, after exposure to actinic light, is completely inert at room temperature and hence permits very great latitude in processing.

Suitable protective components for blocking the isocyanates are mainly phenols, acetone-oxime, methyl ethyl ketoxime, ethyl acetoacetate or malonic ester; however, compounds such as acetylacetone, phthalimide, caprolactam, benzenesulfonamide and 2-mercaptobenzothiazole are also suitable. A very suitable, highly effective blocked isocyanate compound is obtained, for example, from 1 mole of trimethylolpropane, 3 moles of 2,4-diisocyanatotoluene and 3 moles of phenol. Another example of a blocked isocyanate is the isocyanurate derivative obtained by trimerization of the reaction product of 2,4-diisocyanatotoluene with cresol. The blocked isocyanates prepared from toluylene diisocyanate, trimethylolpropane, butanediol and cresol are likewise very suitable crosslinking compounds.

Because they react readily with carboxylic acid groups, another group of very useful crosslinking compounds comprises the conventional carbodiimides, as formed by carbodiimidization of diisocyanates. If an $\alpha,\omega$-diisocyanatopolycarbodiimide is employed as the crosslinking compound, hardening the resist layer in accordance with the invention gives a dense network with the formation of polyacylurea. The carbodiimides can be based on either aromatic or aliphatic diisocyanates. One of the reasons why $\alpha,\omega$-diisocyanatopolycarbodiimides obtained from isophorone diisocyanate are particularly suitable as crosslinking compounds in the novel process is because, as blocked polyisocyanates, they ensure substantial processing latitude between uniform post-expoosure and development of the resist layer.

Advantageous crosslinking compounds containing two or more reactive groups also include polymers containing hydroxyl or amino groups, for example phenol-formaldehyde resins, urea-formaldehyde resins and melamine-formaldehyde resins. Particularly suitable compounds of this class are the novolaks. The high molecular weight crosslinking compounds containing the reactive groups, for example compounds of the last-mentioned type or the glycidyl-containing polymers, are preferably used in the photosensitive resist layer when the latter contains o-nitrocarbinol ester-containing compounds having a relatively low molecular weight, and, as mentioned above, can then serve as a polymeric binder for the said layer. If this layer contains o-nitrocarbinol ester-containing polymers having a high molecular weight, the added crosslinking compounds containing reactive groups can have either a low or a high molecular weight, depending on the intended use and the spectrum of properties desired.

The ratio of the reactive groups in the crosslinking compounds to the o-nitrocarbinol ester groups of the general formula (I) in the compounds containing these groups depends on the type of components employed and is varied, in particular, according to the spectrum of properties desired for the photosensitive resist layer and the relief images or resist images produced from this layer. It can therefore be varied within wide limits, but should in any case be chosen so that the desired degree of crosslinking and of hardening in the relief images and resist images is achieved. If it is important to have a high degree of crosslinking during hardening, very reactive crosslinking compounds are generally used, preferably in excess with respect to the o-nitrocarbinol ester groups. If a lower degree of crosslinking is sufficient, the amount as well as the reactivity of the crosslinking compounds can be reduced accordingly.

The photosensitive resist layers employed in the novel process can, in addition to the compounds possessing the o-nitrocarbinol ester groups and the compounds possessing reactive crosslinking groups and, where relevant, the polymeric binders, also contain other conventional additives and assistants. These additives and assistants can, on the one hand, be compounds which are added to simplify the production of the photosensitive resist layer or of the recording material. These include, for example, plasticizers or flow improvers. Plasticizers are incorporated into the photosensitive resist layer particularly when this layer is to be applied in the dry state to the permanent base, especially when this is done by a lamination process. Examples of plasticizing compounds, which should be compatible with the o-nitrocarbinol ester-containing compounds, in particular with the polymers, are tricresyl phosphate, n-butylbenzyl phthalate and liquid polyesters obtained from an aliphatic dicarboxylic acid and a bifunctional glycol, in particular polyesters obtained from adipic acid and propylene 1,2-glycol or butane-1,4-diol and having a viscosity of from 1,000 to 15,000 cP. If the crosslinking compounds which possess two or more reactive groups and are employed as components of the mixture are low molecular weight substances, these can also act as plasticizers and make the addition of separate plasticizing compounds partially or completely superfluous. The use of flow improvers, eg. silicone oils, is particularly advisable if the photosensitive resist layer is to be applied to a base by casting from solution.

On the other hand, the photosensitive resist layer can contain additives which improve or modify its performance characteristics. These include, for example, catalysts which accelerate the thermal hardening and crosslinking of the imagewise exposed resist layer, ie. the reaction of the free carboxyl groups with the reactive groups of the crosslinking compounds; sensitizers which improve the photosensitivty and the spectral sensitivity of the photosensitive resist layer; and dyes, pigments and/or photochromic substances.

Depending on the type of crosslinking compound used, suitable catalysts for the thermal hardening of the exposed resist layer are the acids and bases conventionally used for such reactions. However, it should be noted that this generally restricts the latitude between uniform post-exposure and development of the resist layer, so that the amount of catalyst is in general kept small. In some cases, it is sufficient to add an amount of catalyst in the ppm range. Examples of basic catalysts are benzyldimethylamine, benzyltrimethylammonium hydroxide, diazabicyclooctane, N,N,N',N'-tetramethyl-1,3-diaminobutane, 2-dimethylamino-2-hydroxypropane, 2-diethylaminomethylphenol, 2,4,6-tri-(dimethylaminoethyl)-phenol, organo-tin compounds, such as tin octoate, etc.

Examples of sensitizers are xanthene dyes, such as fluorescein, eosin and rhodamine S, as well as triplet sensitizers, as described, for example, by N. J. Turro in "Molecular Photochemistry", W. A. Benjamin Inc., New York 1967, page 132. Dyes which have proved useful for incorporation into the photosensitive resist layer include Sudan dyes, polymethine dyes, azo dyes, phthalocyanine dyes and disperse dyes, as well as eosin, crystal violet and malachite green. Particularly advantageous dyes are those which undergo a reversible or irreversible color change on exposure to actinic light. For example, Sudan dyes, polymethine dyes or azo dyes are bleached out by added photoinitiators, such as benzoin ethers, benzil ketals, benzophenone or Michler's ketone, in the photosensitive layer, according to the imagewise exposure. The polymethine dyes of the general formula (II)

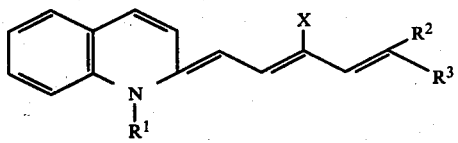

(II)

where R[1] is alkyl, R[2] is —CN, R[3] is —CN, —COOR[4] or —Ph—R[5], R[4] is alkyl, R[5] is —NO$_2$, halogen, alkyl or alkoxy and X is halogen, deserve special mention. Dye intermediates, eg. crystal violet lecuo base or malachite green leuco base, together with halohydrocarbons, in particular haloaromatic hydrocarbons having two or more dichloromethyl groups bonded to a benzene nucleus, are also preferred.

In the process according to the invention, the photosensitive restrict layer is first applied to the permanent base on which the relief images or resist images are to be formed. As mentioned above, this can be effected, for example, by casting the photosensitive resist layer from solution. However, it is also possible first to apply the photosensitive resist layer to a temporary base and then to laminate the said layer, which is generally dry and firm, onto the permanent base by means of a lamination process, using pressure and/or heat. The thickness of the photosensitive resist layer depends on the particular use, and is in general from 0.1 to 2000 μm.

In a particular embodiment of the novel process, the photosensitive resist layer is first produced on a temporary base, eg, a polyester film, pre-exposed uniformly to actinic light for a short time and then laminated onto the permanent base which constitutes the subsequent substrate for the relief image and resist image. This pre-exposure is preferably carried out on that side of the photosensitive resist layer which is subsequently applied to the permanent base, and can last for as long as 70% of the time for the subsequent principal imagewise exposure. This pre-exposure leads, inter alia, to improved adhesion of the resist layer to the permanent base, in particular a metallic or metal oxide substrate, without adversely affecting the faithful and exact reproduction of the transferred image during the production of the relief image or resist image. This pre-exposure can be carried out, by means of an illuminated zone, either during the production of the photosensitive film resist material or during lamination directly before application of the photosensitive resist layer to the permanent base, so that this embodiment of the process can be carried out without any particular additional expense or process steps.

The photosensitive resist layer applied to the permanent base is, in accordance with the invention, first exposed imagewise to actinic light in a conventional manner, through a suitable image-bearing transparency. Suitable light sources for this purpose are those which emit actinic light having a wavelength of from 200 to 600 nm, preferably from 300 to 420 nm, eg. carbon arc lamps, high-pressure mercury lamps, high-pressure xenon lamps and, in particular, low-pressure mercury fluorescence lamps. The times for the imagewise exposure, which depend in particular on the type and thickness of the photosensitive resist layer, are in general about 0.05–50 minutes, and also vary with the strength of the light source used.

After the imagewise exposure of the photosensitive resist layer, during which, in the exposed areas, the o-nitrocarbinol ester groups undergo cleavage to form free carboxyl groups, the exposed areas of the layer are subjected to thermal crosslinking and hardening. This thermal hardening can, for example, be carried out at room temperature, but very long hardening times are generally required in this case. Advantageously, therefore, hardening and crosslinking are carried out at elevated temperatures, by heating the imagewise exposed resist layer, preferably at from 50° to 250° C., in particular at from 60° to 200° C. The duration of hardening and crosslinking, which can be from about 10 minutes to a few hours, eg. 5 hours, depends on the type and reactivity of the crosslinking compound employed, on the number of free carboxyl groups produced during imagewise exposure, on the desired degree of crosslinking and hardening, on the layer thickness, etc. For example, crosslinking of the free carboxyl groups with epoxide compounds requires relatively high hardening temperatures. For example, an equimolar noncatalyzed mixture of a carboxylic acid and a diepoxide based on 2,2-bis-(p-hydroxyphenyl)-propane has to be heated for from 2 to 4 hours at about 150°–200° C. to convert all of the epoxide groups. The hardening can also be carried out stepwise, for example using an excess or less than the stoichiometric amount of an epoxide compound or in general of the crosslinking compounds, for example by first heating the mixture to not more than about 150° C. and then carrying out final hardening at above 150° C., in particular at about 200° C. or above.

After it has been subjected to thermal hardening and crosslinking, the imagewise exposed resist layer is post-exposed uniformly to actinic light, in accordance with the invention. As a result, free carboxyl groups are produced in the non-hardened, non-crosslinked areas of the said layer, and these carboxyl groups enable these areas of the layer to be washed out subsequently with an aqueous developer. Suitable light sources for this uniform post-exposure are those used for the above imagewise exposure. Quite generally, the uniform post-exposure is carried out using such an intensity and for such a period that the number of free carboxyl groups formed in the resist layer is sufficiently high to enable the non-hardened, non-crosslinked areas of the layer to be washed out with the aqueous developer. The duration of the uniform post-exposure is usually from 0.05 to 50 minutes. We have found, surprisingly, that, in accordance with the invention, the resist layer can be washed out with an aqueous developer even when the photosensitive resist layer employed contains a low molecular weight compound possessing o-nitrocarbinol ester groups of the formula (I), and a polymeric binder which itself is insoluble in water.

The aqueous developer used according to the invention can be water as such or a mixture of water with a water-soluble organic solvent eg. a mixture of water with an aliphatic alcohol, in particular methanol or ethanol; a ketone, eg. acetone, or a cyclic ether, eg. tetrahydrofuran. In particular, water is employed as the developer. The pH of the developer is advantageously higher than 7.5, and some or all of the free carboxyl groups are therefore converted to the salt form. The optimum amount of alkali, or the optimum pH, is of course dependent on the layer material used and on the exposure time and intensity during the uniform post-exposure, ie. on the amount of free carboxyl groups formed during this procedure. Alkalis which can be added to the developer are, for example, borax, disodium hydrogen phosphate, sodium carbonate or alkali metal hydroxides, and examples of suitable organic bases are diethanolamine and triethanolamine. For example, surfactants, sodium carboxymethylcellulose, polyvinyl alcohol, polysodium acrylate, etc. can also be added to the washout solution.

The other conditions (eg. duration and temperature) for the development of the exposed resist layer should be adapted to the processing latitude available. The photosensitive resist layer contains crosslinking compounds which are capable of reacting with the free carboxyl groups formed during the uniform post-exposure, but the areas of the layer which have not been subjected to imagewise exposure and hardened should be removed, during development, completely down to the base, with the formation of a sharp image; consequently, development of the resist layer is carried out as a rule directly after the uniform post-exposure. The areas of the layer which have not been subjected to imagewise exposure and hardened can be washed out in a conventional manner, for example by spraying, rubbing out or brushing out with the aqueous developer. To accelerate the development process, it is possible to employ elevated temperaures, for example as high as about 40° C., depending on the crosslinking compound present in the resist layer. The development time is generally a few minutes.

The relief images or resist images obtained after the resist layer has been washed out can be dried in a conventional manner. A particular advantage of the novel process is that the resulting relief images and resist images can be subjected to thermal post-curing and subsequent crosslinking, with the result that their properties can be varied and adjusted, and adapted to the particular intended use. The free carboxyl groups required for the thermal post-curing and subsequent crosslinking are as a rule produced in sufficient numbers as early as the stage at which the resist layer is uniformly post-exposed. If necessary, the conditions during the uniform post-exposure should be adapted in an appropriate manner to the requirements of thermal post-curing and subsequent crosslinking. The latter processes can be carried out in the same manner as the selective hardening and crosslinking of the imagewise exposed areas, as described above. To do this, the relief image or resist image is generally heated, preferably at from 50° to 250° C., in particular at from 60° to 200° C., for from a few minutes to a few hours, if appropriate in several stages of increasing temperature. This post-curing and subsequent crosslinking can give relief images and resist images having, in particular, higher mechanical strength and thermal stability and greater resistance to solvents. Where thermal post-curing and subsequent crosslinking is carried out, the selective thermal hardening and crosslinking of the imagewise exposed areas of the photosensitive resist layer are preferably effected for a relatively short time, since, in this case, selective thermal hardening and crosslinking of the image areas need produce only a difference in solubility, while the desired end properties of the relief image or resist image can be obtained via the thermal post-curing and subsequent crosslinking.

The novel process provides high resolution and gives relief images or resist images which have high thermal stability particularly when exposed to thermal stresses of short duration, and, depending on the component, are stable, for example, at temperatures of 270° C. or more, and possess excellent mechanical properties, high dielectric strength and high tracking resistance as well as greatly improved resistance to corrosive process chemicals, in particular to strong acids and alkalis, as may be used in the further processing of the relief images or resist images.

The novel process or the relief images and resist images produced by means of this process are particularly advantageously used for the production of thick-film circuits, thin-film circuits, for example for electonic engineering, and integrated circuits, semiconductors generally, printed circuits and solder masks, as well as for the production of offset printing plates. The techniques in the above fields of use where photosensitive recording materials are employed are sufficiently known, and do not require further description here. The resist image produced according to the invention, for example after modification of the exposed areas of the base, can, if desired, be removed from the base, for example by stripping with a suitable solvent, such as methylene chloride.

The Examples which follow illustrate the invention. Parts and percentages are by weight, unless stated otherwise.

EXAMPLE 1

72 parts of a methyl methacrylate copolymer, containing 25% of o-nitrobenzyl acrylate as copolymerized units, 27 parts of a bisphenol A diglycidyl ether (Epikote ®828 from Shell), 0.7 part of benzil dimethyl ketal, 0.1 part of a black dye and 0.2 part of a polymethine dye of the general formula (II), where $R^1$ is methyl, $R^2$ is nitrile, $R^3$ is —COOEt and X is chlorine, were dissolved in 160 parts by volume of ethyl acetate. Two photosensitive resist layers were cast from this solution onto two polyethylene terephthalate films (temporary bases) so that layers which were each 50 μm thick resulted after removal of the solvent and drying. The free surfaces of the resulting photosensitive resist layers were laminated, at 100° C., onto both sides of a printed circuit. The polyester films were removed, after which the two photosensitive resist layers were each exposed for 4 minutes through a photographic negative in a flatplate exposure unit. Thereafter, the photosensitive recording material was heated at 60° C., 80° C., 100° C., 120° C. and 150° C. for 1 hour in each case, and then at 200° C. for 0.5 hours, with the result that the imagewise exposed areas of the resist layers underwent selective thermal hardening and crosslinking. The two resist layers were then post-exposed uniformly for 4 minutes in each case, after which they were washed out in the course of 10 minutes with a developer comprising 81% of water, 16% of 2-butoxyethanol and 3% of triethanolamine. The resulting sharp resist images, which corresponded exactly to the originals, were freed from residual developer by blowing with compressed air. The resist images obtained possessed the electrical properties desired for solder masks, thermal stability and very good mechanical strength. The circuit board provided with the solder masks could be fitted with components and soldered in a conventional manner.

EXAMPLE 2

A solution of 110 parts of an acrylate copolymer (87% of 1-(o-nitrophenyl)-ethyl acrylate and 13% of acrylamide), 12 parts of a bisphenol A diglycidyl ether (Epikote ®828 from Shell) and 1.2 parts of a blue dye in 800 parts of ethyl acetate was filtered and then applied to an electrically roughened, anodically oxidized aluminum sheet suitable for offset printing (average peak-tovalley height: 3.5 μm) in such a manner that a photosensitive resist layer having a dry weight of 1.5 g/m² resulted. The layer was air-dried at 60° C. and then exposed imagewise for one minute, through a photographic negative, to a doped high-pressure mercury lamp 80 cm away. The exposed areas of the resist layer were then selectively hardened and crosslinked by heating this layer at increasing temperatures from 60° to 150° C. The resist layer was then subjected to uniform post-exposure for about 10 minutes, after which it was washed out in a spray washer with a mixture of 82 parts of water, 15 parts of 2-butoxyethanol and 3 parts of triethanolamine and then dried to give an offset printing plate suitable for very long runs.

We claim:

1. A process for the production of a relief image or resist image which constitutes a negative image of an image-bearing transparency, wherein a photosensitive resist layer which is applied to a base, is crosslinkable after exposure and contains, as the photosensitive component, a compound possessing two or more o-nitrocarbinol ester groups of the formula (I)

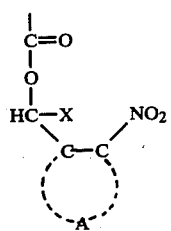

where A is a radical of an unsubstituted or substituted 5-membered to 14-membered aromatic or heteroaromatic ring system, and X is hydrogen, alkyl of 1 to 8 carbon atoms or an unsubstituted or substituted aryl or aralkyl radical, and which also contains a compound which effects crosslinking and possesses two or more reactive groups which are capable of reacting with —COOH groups under the action of heat to form a covalent chemical bond, is exposed imagewise to actinic light, the exposed areas of the resist layer are subjected to selective thermal hardening and crosslinking, and the resist layer is post-exposed uniformly to actinic light and then washed out with an aqueous developer.

2. A process as claimed in claim 1, wherein the photosensitive resist layer contains a compound possessing o-nitrocarbinol ester groups of the formula (I), in which the carbinol on which the o-nitrocarbinol ester groups of the formula (I) are based is o-nitrobenzyl alcohol, 2-nitro-6-chlorobenzyl alcohol, 2-nitro-4-cyanobenzyl alcohol, 2-nitro-4,5-dimethoxybenzyl alcohol, α-methyl-o-nitrobenzyl alcohol, α-phenyl-o-nitrobenzyl alcohol or α-(o-nitrophenyl)-o-nitrobenzyl alcohol.

3. A process as claimed in claim 1, wherein the photosensitive resist layer contains, as the compound possessing the o-nitrocarbinol ester groups of the formula (I), a di- and/or polyester of a low molecular weight di- and/or polycarboxylic acid and a polymeric binder which is compatible with this ester.

4. A process as claimed in claim 1, wherein the photosensitive resist layer contains a polymer which has a molecular weight of above 500 and contains not less than 5% by weight, based on the molecular weight of the polymer, of aromatic and/or heteroaromatic o-nitrocarbinol ester groups of the formula (I) bonded in the molecule.

5. A process as claimed in claim 4, wherein the photosensitive resist layer contains a polymer which possesses o-nitrocarbinol ester groups of the formula (I) and is derived from a homopolymer or copolymer of acrylic acid, methacrylic acid, maleic acid, fumaric acid and/or crotonic acid.

6. A process as claimed in claim 1, wherein the photosensitive resist layer contains a compound, in particular a polymer, which, in addition to the o-nitrocarbinol ester groups of the formula (I), also contains incorporated in the molecule the crosslinking groups which are reactive to —COOH groups.

7. A process as claimed in claim 6, wherein the compound possessing o-nitrocarbinol ester groups of the formula (I) contains, as crosslinking reactive groups, amine, imine, amide, epoxide, hydroxyl, isocyanate and/or blocked isocyanate groups.

8. A process as claimed in claim 1, wherein the photosensitive resist layer contains, in addition to the compound possessing the o-nitrocarbinol ester groups of the formula (I), one or more crosslinking compounds possessing two or more reactive groups of the type mentioned.

9. A process as claimed in claim 8, wherein the photosensitive resist layer contains, as crosslinking compounds, epoxides, isocyanates, blocked isocyanates, α,ω-diisocyanatopolycarbodiimides, alcohols and/or amines.

10. A process as claimed in claim 1, wherein the photosensitive resist layer contains, as further additives, plasticizers, flow improvers, catalysts for the thermal hardening, sensitizers, dyes, pigments and/or photochromic substances.

11. A process as claimed in claim 1, wherein the thermal hardening and crosslinking of the imagewise exposed resist layer is carried out at from 50° to 250° C.

12. A process as claimed in claim 1, wherein, after washing out with the aqueous developer, thermal post-curing and subsequent crosslinking is also carried out.

13. A process as claimed in claim 1, wherein the solid photosensitive resist layer is laminated onto the base using pressure and/or heat.

14. A process as claimed in claim 13, wherein the photosensitive resist layer, before being laminated onto the base, is pre-exposed uniformly for a short time to actinic light, on that side which faces the base.

* * * * *